(12) United States Patent
Kotani et al.

(10) Patent No.: US 7,949,967 B2
(45) Date of Patent: May 24, 2011

(54) DESIGN PATTERN CORRECTING METHOD, PROCESS PROXIMITY EFFECT CORRECTING METHOD, AND SEMICONDUCTOR DEVICE MANUFACTURING METHOD

(75) Inventors: Toshiya Kotani, Machida (JP); Shigeki Nojima, Yokohama (JP); Shimon Maeda, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 267 days.

(21) Appl. No.: 12/269,705

(22) Filed: Nov. 12, 2008

(65) Prior Publication Data

US 2009/0077530 A1 Mar. 19, 2009

Related U.S. Application Data

(62) Division of application No. 11/115,322, filed on Apr. 27, 2005, now abandoned.

(30) Foreign Application Priority Data

Apr. 28, 2004 (JP) ................................. 2004-134011

(51) Int. Cl.
G06F 17/50 (2006.01)
(52) U.S. Cl. ........................................... 716/53; 716/54
(58) Field of Classification Search ................... 716/2, 4, 716/19, 53, 54
See application file for complete search history.

(56) References Cited

U.S. PATENT DOCUMENTS

| | | | |
|---|---|---|---|
| 5,740,068 A * | 4/1998 | Liebmann et al. ............... | 716/21 |
| 6,243,855 B1 | 6/2001 | Kobayashi et al. | |
| 6,570,174 B1 | 5/2003 | Tounai et al. | |
| 6,670,081 B2 | 12/2003 | Laidig et al. | |
| 6,687,885 B2 | 2/2004 | Ono | |
| 6,853,743 B2 | 2/2005 | Kotani et al. | |
| 2004/0263866 A1 | 12/2004 | Ogawa | |
| 2005/0251781 A1 | 11/2005 | Kotani et al. | |
| 2007/0065730 A1 * | 3/2007 | Misaka ............................ | 430/5 |
| 2009/0077529 A1 | 3/2009 | Kotani et al. | |
| 2009/0077530 A1 | 3/2009 | Kotani et al. | |

FOREIGN PATENT DOCUMENTS

| | | |
|---|---|---|
| JP | 3-25954 | 2/1991 |
| JP | 9-81622 | 3/1997 |
| JP | 2002-83757 | 3/2002 |
| JP | 2002-258459 | 9/2002 |
| JP | 2403-195473 | 7/2003 |

OTHER PUBLICATIONS

Final Notice of Rejection issued by the Japanese Patent Office mailed Nov. 10, 2009, in related Japanese Patent Application No. 2004-134011.

Notice of Reasons for Rejection issued by the Japanese Patent Office mailed Jun. 30, 2009, for related Japanese Patent Application No. 2004-134011.

* cited by examiner

*Primary Examiner* — Jack Chiang
*Assistant Examiner* — Suresh Memula
(74) *Attorney, Agent, or Firm* — Finnegan, Henderson, Farabow, Garrett & Dunner, L.L.P.

(57) ABSTRACT

A design pattern correcting method of correcting a design pattern in relation to a minute step of the design pattern, is disclosed, which comprises extracting at least one of two edges extended from a vertex of the design pattern, measuring a length of the extracted edge, determining whether or not the length of the measured edge is shorter than a predetermined value, extracting two vertexes connected to the extracted edge if it is determined that the length of the extracted edge is shorter than the predetermined value, and reshaping the design pattern to match positions of the two extracted vertexes with each other.

8 Claims, 13 Drawing Sheets

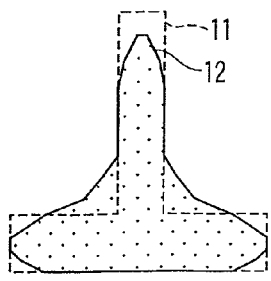
F I G. 1
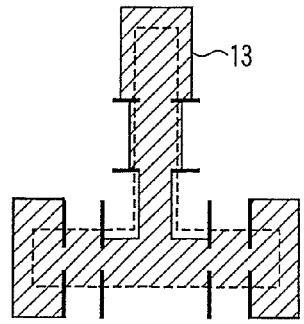
F I G. 2
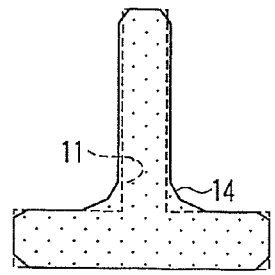
F I G. 3
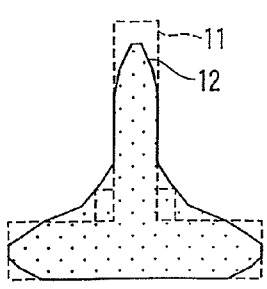
F I G. 4
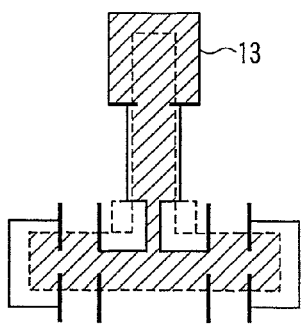
F I G. 5
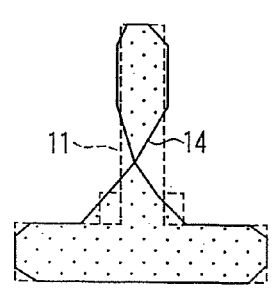
F I G. 6

DESIGN PATTERN CORRECTING METHOD, PROCESS PROXIMITY EFFECT CORRECTING METHOD, AND SEMICONDUCTOR DEVICE MANUFACTURING METHOD

CROSS-REFERENCE TO RELATED APPLICATIONS

This application is a division of U.S. application Ser. No. 11/115,322, filed Apr. 27, 2005 now abandoned, which is based upon and claims the benefit of priority from prior Japanese Patent Application No. 2004-134011, filed Apr. 28, 2004. The entire contents of these applications are incorporated herein by reference in their entirety.

BACKGROUND OF THE INVENTION

1. Field of the Invention

The present invention relates to a design pattern correcting method for correcting a design pattern, a design pattern forming method for forming a design pattern based on a design rule, a process proximity effect correcting method for, when forming a desired pattern planar shape on a wafer using a design pattern, implementing a processing for proximity effect correction, a semiconductor device and a design pattern correcting program.

2. Description of the Related Art

In recent years, progress of semiconductor manufacturing technology is very remarkable and semiconductors whose minimum design rule is 0.18 μm have been mass-produced. Such miniaturization has been achieved by remarkable progresses of such fine pattern forming technology as mask process technology, lithography process technology and etching process technology.

At a time when the pattern size was sufficiently large, a mask pattern having the same shape as a pattern written by a designer was formed and the mask pattern was transferred to resist coated on a wafer with a photolithography machine, thereby forming the designed mask pattern. However, influence made by refraction of exposure light upon the dimension of the wafer has been increased by the miniaturization of the pattern size, and the process technology for the mask and wafer for forming such a fine pattern accurately has become difficult. Therefore, it has been difficult to form a pattern just the same as a designed one on a wafer even if the same mask as the design pattern is employed.

In order to improve the correspondence of the design pattern, technologies called optical proximity correction (OPC) for implementing a predetermined correction and process proximity correction (PPC) have been used for a mask pattern for forming the same pattern as the design pattern on the wafer.

The OPC technology and PPC technology (hereinafter expressed as PPC including OPC) are classified largely to two methods. According to one of them, a moving amount of an edge constituting a design pattern corresponding to the width of the design pattern or a most proximate distance between the patterns is specified as a rule, and the edge is moved following the rule. A second method is to optimize an edge moving amount such that the same pattern as the design pattern can be formed on the wafer by using a lithography simulator capable of estimating the diffracted light intensity distribution of exposure light. Further, a correcting method capable of achieving a higher precision correction by combining these two methods has been proposed (for example, Jpn. Pat. Appln. KOKAI Publication No. 2002-258459).

Generally, the PPC method using the lithography simulator is called model base PPC. According to this method, by comparing an optical image calculated from a model with a design pattern, the edge of the pattern is moved corresponding to the comparison result. At that time, the design pattern needs to be divided to edge groups of a certain unit, and an appropriate correction value is calculated for each edge. With miniaturization of lithography intensified, the resolution of the pattern on the wafer has been deteriorated more and more, and particularly, deterioration (meaning that the shape of the pattern cannot be formed on the wafer just as the design pattern indicates) of the resolution at a corner portion of the pattern is remarkable.

Therefore, when the pattern is divided to edge groups, usually the corner portion of the pattern in which the deterioration of the resolution is particularly serious is preferentially divided. Consequently, such an edge division that the corner portion of the pattern is optimized is achieved, so that the shape of the corner portion in which the deterioration of the resolution is serious can be optimally corrected.

However, examples of the design pattern include a design pattern having a small step in the vicinity of a corner portion thereof. In the case of setting a design rule of the layout or using an automatic layout design tool indispensable for designing a large-scale device, generation of the step in the vicinity of the pattern corner portion is an unavoidable problem. Because the edge division is started from the corner portion of the pattern as described above, even a minute step is recognized as a corner portion. As a result, predetermined edge division cannot be performed between an original corner portion and the minute step, and consequently, the correction is not carried out in a predetermined manner at the corner portion in which the deterioration of the resolution is serious, so that a problem may occur in mask formation or the configuration of the wafer.

In such a pattern having a small step in the vicinity of a corner portion thereof, conventionally, it is difficult to finish the corner portion into a desired pattern and this is a main cause which deteriorates pattern accuracy.

BRIEF SUMMARY OF THE INVENTION

According to a first aspect of the present invention, there is provided a design pattern correcting method of correcting a design pattern in relation to a minute step of the design pattern, comprising:

extracting at least one of two edges extended from a vertex of the design pattern;

measuring a length of the extracted edge;

determining whether or not the length of the measured edge is shorter than a predetermined value;

extracting two vertexes connected to the extracted edge if it is determined that the length of the extracted edge is shorter than the predetermined value; and reshaping the design pattern to match positions of the two extracted vertexes with each other.

According to a second aspect of the present invention, there is provided a design pattern correcting method of correcting a design pattern in relation to a minute step of the design pattern, comprising:

extracting an edge extended from a vertex of the design pattern;

measuring a length of the extracted edge;

determining whether or not the length of the measured edge is shorter than a predetermined value;

judging that a design rule is violated to output an error if it is determined that the length of the edge is shorter than the predetermined value; and reshaping the design pattern not to violate the design rule.

According to a third aspect of the present invention, there is provided a design pattern process proximity effect correcting method of correcting a design pattern process proximity effect of a design pattern in relation to a minute step of the design pattern, comprising:

extracting an edge extended from a predetermined vertex of the design pattern;

measuring a length of the extracted edge;

determining whether or not the length of the measured edge is shorter than a predetermined value;

extracting two vertexes connected to the extracted edge if it is determined that the length of the extracted edge is shorter than the predetermined value;

dividing the extracted edge into edge units for pattern correction with a vertex excluding the two extracted vertexes as a starting point;

allocating a correction value for the each divided edge unit; and resizing the design pattern corresponding to the correction value for the each allocated edge unit.

According to a fourth aspect of the present invention, there is provided a design pattern process proximity effect correcting method of making a process proximity effect correction on a design pattern corrected by the design pattern correcting method as recited in the first aspect of the present invention.

According to a fifth aspect of the present invention, there is provided a design pattern process proximity effect correcting method of making a process proximity effect correction on a design pattern corrected by the design pattern correcting method as recited in the second aspect of the present invention.

According to a sixth aspect of the present invention, there is provided a mask manufacturing method for manufacturing a mask by using a design pattern corrected by the design pattern process proximity effect correcting method as recited in the third aspect of the present invention.

According to a seventh aspect of the present invention, there is provided a mask manufacturing method for manufacturing a mask by using a design pattern corrected by the design pattern process proximity effect correcting method as recited in the fourth aspect of the present invention.

According to an eighth aspect of the present invention, there is provided a mask manufacturing method for manufacturing a mask by using a design pattern corrected by the design pattern process proximity effect correcting method as recited in the fifth aspect of the present invention.

According to a ninth aspect of the present invention, there is provided a semiconductor device manufacturing method of manufacturing a semiconductor device, comprising forming a pattern of a desired shape on a wafer by exposing the wafer to light by using a mask manufactured according to the mask manufacturing method as recited in the sixth aspect of the present invention.

According to a tenth aspect of the present invention, there is provided a semiconductor device manufacturing method of manufacturing a semiconductor device, comprising forming a pattern of a desired shape on a wafer by exposing the wafer to light by using a mask manufactured according to the mask manufacturing method as recited in the seventh aspect of the present invention.

According to an eleventh aspect of the present invention, there is provided a semiconductor device manufacturing method of manufacturing a semiconductor device, compris-ing forming a pattern of a desired shape on a wafer by exposing the wafer to light by using a mask manufactured according to the mask manufacturing method as recited in the eighth aspect of the present invention.

According to a twelfth aspect of the present invention, there is provided a program of causing a computer to execute a design pattern correcting method, comprising:

extracting at least one of two edges extended from a vertex of the design pattern;

measuring a length of the extracted edge;

determining whether or not the length of the measured edge is shorter than a predetermined value;

extracting two vertexes connected to the extracted edge if it is determined that the length of the extracted edge is shorter than the predetermined value; and reshaping the design pattern to match positions of the two extracted vertexes with each other.

According to a thirteenth aspect of the present invention, there is provided a program of causing a computer to execute a design pattern correcting method, comprising:

extracting an edge extended from a vertex of the design pattern;

measuring a length of the extracted edge;

determining whether or not the length of the measured edge is shorter than a predetermined value;

judging that a design rule is violated to output an error if it is determined that the length of the edge is shorter than the predetermined value; and reshaping the design pattern not to violate the design rule.

According to a fourteenth aspect of the present invention, there is provided a program of causing a computer to execute a design pattern process proximity effect correcting method, comprising:

extracting an edge extended from a predetermined vertex of the design pattern;

measuring a length of the extracted edge;

determining whether or not the length of the measured edge is shorter than a predetermined value;

extracting two vertexes connected to the extracted edge if it is determined that the length of the extracted edge is shorter than the predetermined value;

dividing the extracted edge into edge units for pattern correction with a vertex excluding the two extracted vertexes as a starting point;

allocating a correction value for the each divided edge unit; and resizing the design pattern corresponding to the correction value for the each allocated edge unit.

BRIEF DESCRIPTION OF THE SEVERAL VIEWS OF THE DRAWING

FIG. 1 is a diagram showing a finished pattern shape on a wafer to a design pattern 11 when there is no minute step in the vicinity of a pattern corner portion;

FIG. 2 is a diagram showing a pattern shape of a pattern after OPC of the design pattern in FIG. 1;

FIG. 3 is a diagram showing a finished pattern shape on the wafer after OPC of the design pattern of FIG. 1;

FIG. 4 is a diagram showing a finished pattern shape on the wafer to the design pattern 11 when there is a minute step in the vicinity of the pattern corner portion;

FIG. 5 is a diagram showing a pattern shape after OPC of the design pattern in FIG. 4;

FIG. 6 is a diagram showing a finished pattern shape on the wafer after OPC of the design pattern of FIG. 5;

DETAILED DESCRIPTION OF THE INVENTION

Embodiments of the present invention will be described with reference to the accompanying drawings.

First Embodiment

FIGS. 1 to 3 show changes of a pattern in case where a minute step exists in the vicinity of a pattern corner portion. FIGS. 4 to 6 show changes of a pattern in case where no minute step exists in the vicinity of the pattern corner portion.

FIGS. 1 to 3 show examples in which no minute step exist in the vicinity of the pattern corner portion, FIG. 1 shows a finished pattern shape 12 on a wafer to a design pattern 11, FIG. 2 shows a mask pattern shape 13 after OPC and FIG. 3 shows a finished pattern shape 14 on the wafer after OPC. FIGS. 4 to 6 show examples in which a minute step exists in the vicinity of the pattern corner portion and FIG. 4 shows the finished pattern shape 12 on the wafer to the design pattern 11, FIG. 5 shows a mask pattern shape 13 after OPC and FIG. 6 shows a finished pattern shape 14 on the wafer after OPC.

Because if no minute step exists as shown in FIGS. 1 to 3, edge division can be implemented to a predetermined position with the corner portion as a starting point, the finished planar shape of the corner portion on the wafer can be finished as desired.

To the contrary, if a minute step exists in the vicinity of the corner portion, as shown in FIGS. 4 to 6, the minute step is regarded identical to the corner portion under a conventional method. Therefore, the edge cannot be divided at a predetermined position due to the existence of the minute step. As a result, no predetermined shape can be obtained on the wafer, thereby reducing yield rate of the device and mask production.

Figure 7:
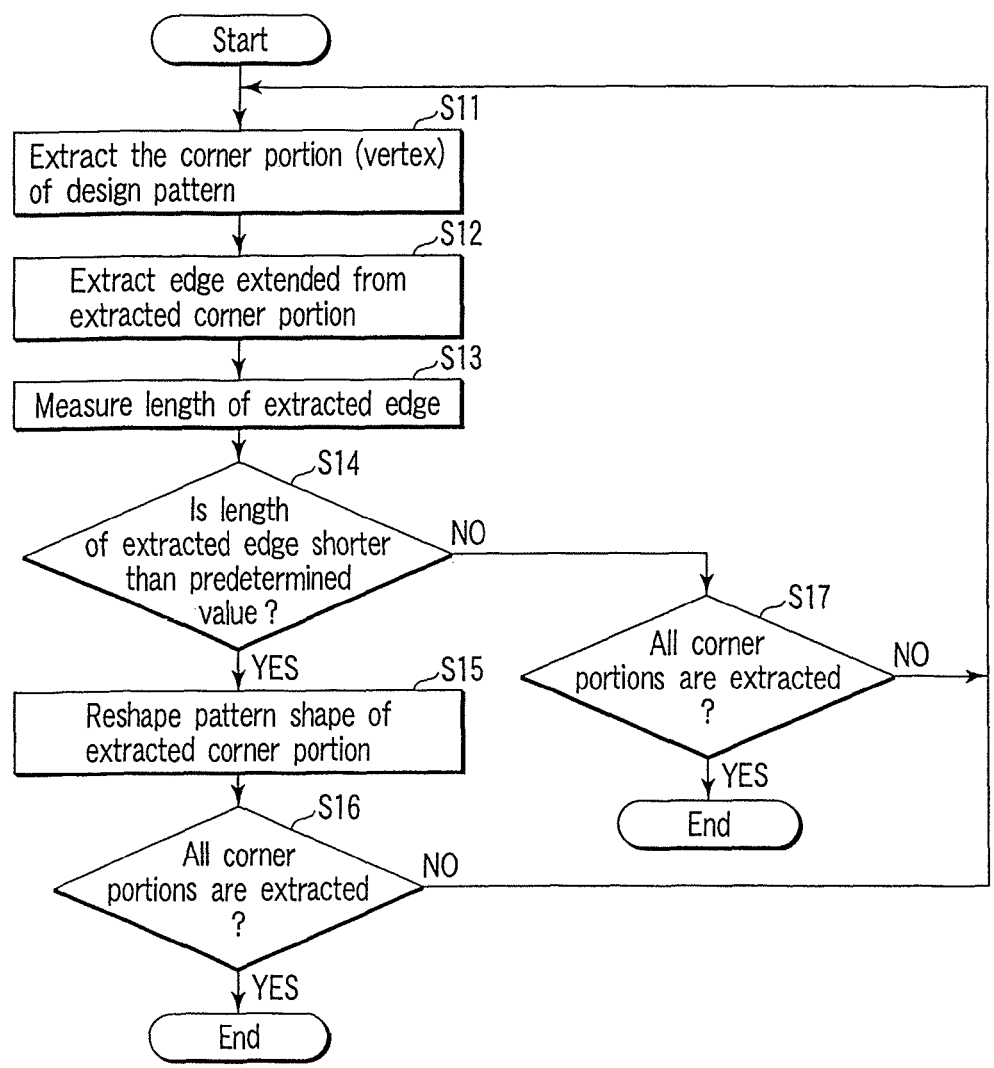
FIG. 7 shows an example of a flow chart for correcting a design pattern in which a minute step exists in the vicinity of the pattern corner portion.

Then, according to this embodiment, a design rule is formed so as to exclude such a minute step at the design stage as described below. That is, explaining with reference to a flow chart shown in FIG. 7, 1. Extracting a corner portion (vertex) of a design pattern (step S11)
2. Extracting an edge extended from the extracted corner portion (step S12)
3. Measuring the length of the extracted edge (step S13)
4. Determining the length of the measured edge (step S14)
5. If it is determined that the length of the measured edge is shorter than a predetermined value (when it is determined that it is a minute step), that is, if the determination result is YES, it is recognized that the design rule is violated (step S14) and error is outputted. Here, the predetermined value mentioned here is less than a minimum value which limits the design pattern.

Then, by reshaping the pattern of a portion which is determined to be an error, the minute step of the design pattern is excluded (step S15). Next, whether or not all corner portions are extracted is determined (step S16) and if the result is YES, this procedure is finished. If the determination result is NO, the procedure returns to step S11 for extracting the corner portion of the design pattern. If the determination result is NO in step S14 for determining the length of the extracted edge, whether or not all the corner portions are extracted is determined (step S17) and if the determination result is YES, this procedure is finished. If the determination result is NO, the procedure returns to step S11 for extracting the corner portion of the design pattern.

In the above-described steps, the design pattern is corrected. Then, process proximity effect correction is carried out on the design pattern corrected in such a way and a mask is manufactured with the design pattern which has undergone the process proximity effect correction.

Second Embodiment

Figure 8:
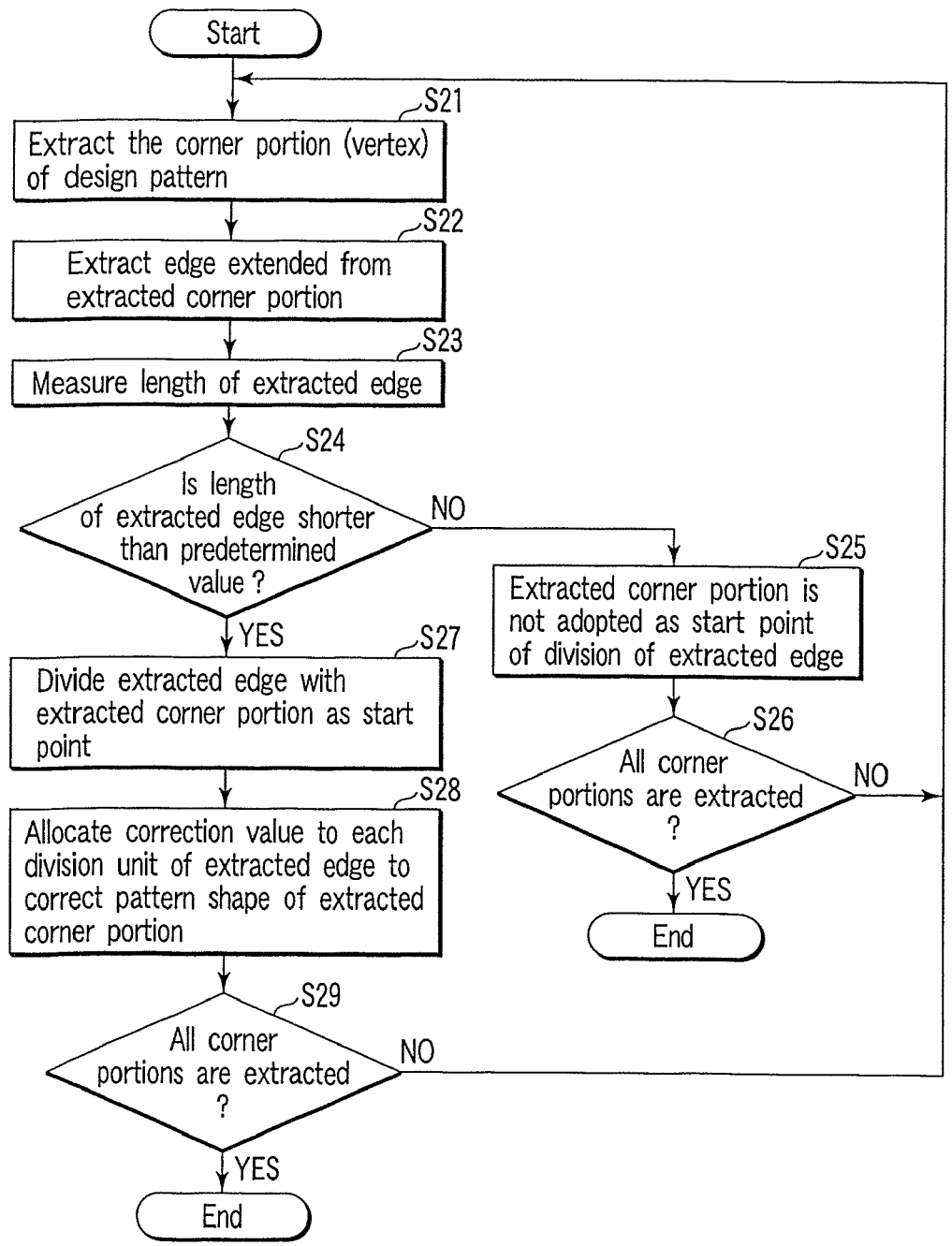
FIG. 8 shows an example of a flow chart for correcting a design pattern in which a minute step exists in the vicinity of the pattern corner portion.

Next, a second embodiment of the invention in which edge division is carried out without affecting the edge division even if a minute step exists in a design pattern will be described with reference to a flow chart of FIG. 8.

1-4. Step S21 to step S24 which are the same as step S11 to step S14 of the first embodiment are carried out.

5. If it is determined that the length of the edge is shorter than a predetermined value in step S24 (when it is determined to be a minute step), that is, the determination result is YES, the extracted corner portion (vertex constituting the minute step) is not adopted as an edge division start point (step S25).

6. If the determination result is NO in step S24, the extracted corner portion is adopted as an edge division start point (step S27).

7. A correction value is allocated for each division unit of the edge and resize is made corresponding to the correction value (step S28).

Next, whether or not all corner portions are extracted is determined (step S29) and if the result is YES, this procedure is finished. If the determination result is NO, the procedure returns to step S21 for extracting the corner portion of the design pattern. If the determination result is YES in step S24 for determining the length of the extracted edge and the extracted corner portion is not adopted as an edge division start point (step S25), whether or not all the corner portions are extracted is determined (step S26) and if the determination result is YES, this procedure is finished. If the determination result is NO, the procedure returns to step S21 for extracting the corner portion of the design pattern.

In the above-described steps, the process proximity effect correction is carried out to the design pattern. Then, a mask is manufactured with the design pattern which has undergone process proximity effect correction.

Third Embodiment

Figure 9:
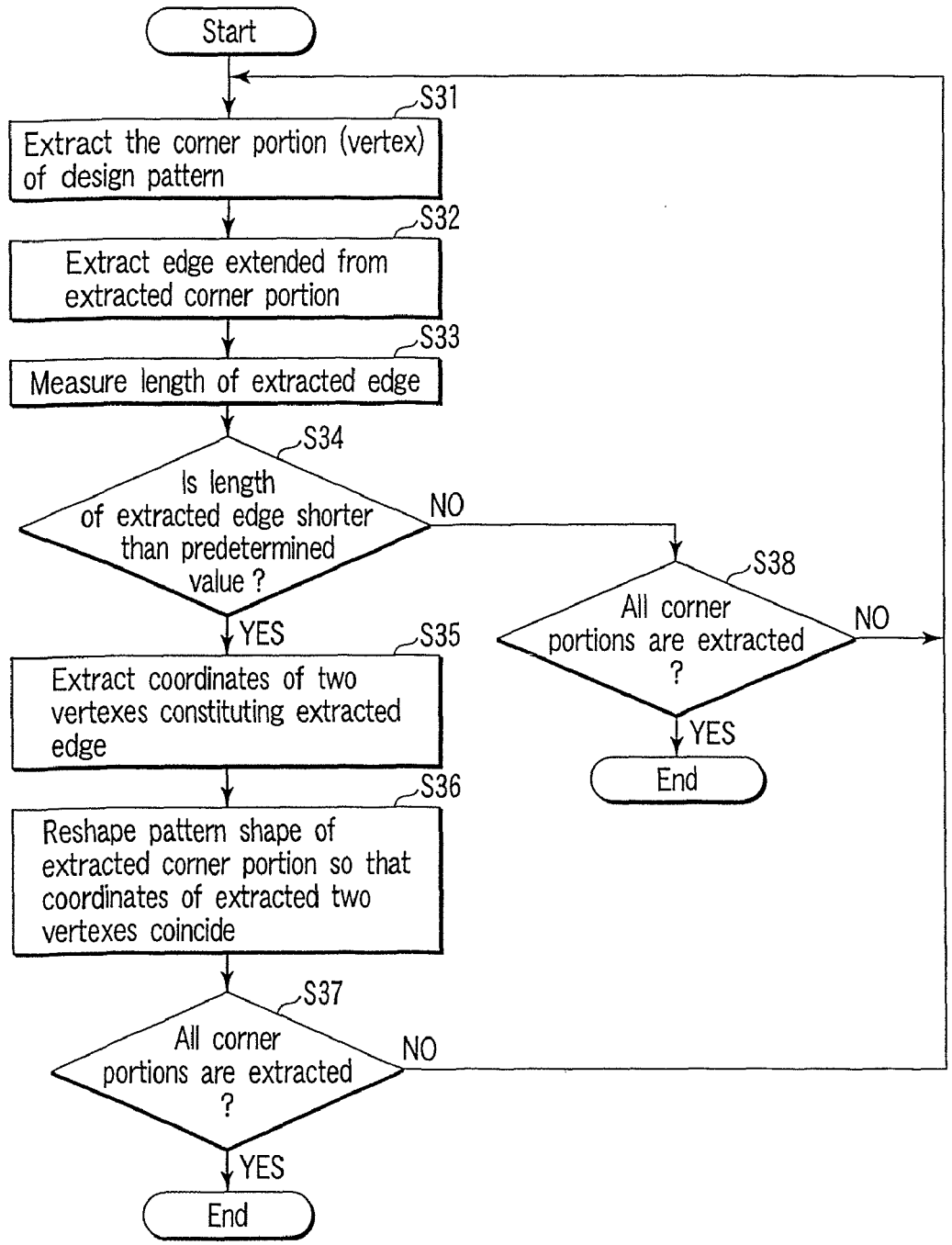
FIG. 9 shows an example of a flow chart for correcting a design pattern in which a minute step exists in the vicinity of the pattern corner portion.

Next, a method for forming a new design pattern by excluding a minute step existing in a design pattern will be described with reference to a flow chart of FIG. 9. According to this method, following steps are executed.

1. Extracting a corner portion of a design pattern (step S31)
2. Extracting an edge extended from the extracted corner portion (step S32)
3. Measuring the length of the extracted edge (step S33)
4. Determining the length of the extracted edge (step S34)
5. If it is determined that the length of the edge is short (when determined to be a minute step), coordinates of two vertexes constituting those edges are extracted (step S35).

6. The design pattern is reshaped such that the coordinates of the extracted two vertexes coincide each other (step S36).

Next, whether or not all corner portions are extracted is determined (step S37) and if the result is YES, this procedure is finished. If the determination result is NO, the procedure returns to step S31 for extracting the corner portion of the design pattern. If the determination result is NO in step S34 for determining the length of the extracted edge, whether or not all the corner portions are extracted is determined (step S38) and if the determination result is YES, this procedure is finished. If the determination result is NO, the procedure returns to step S31 for extracting the corner portion of the design pattern.

In the above-described steps, a design pattern excluding the minute step is formed. Then, the process proximity effect correction is carried out to the formed design pattern and a mask is manufactured using the design pattern which has undergone the process proximity effect correction.

Figures 10, 11:
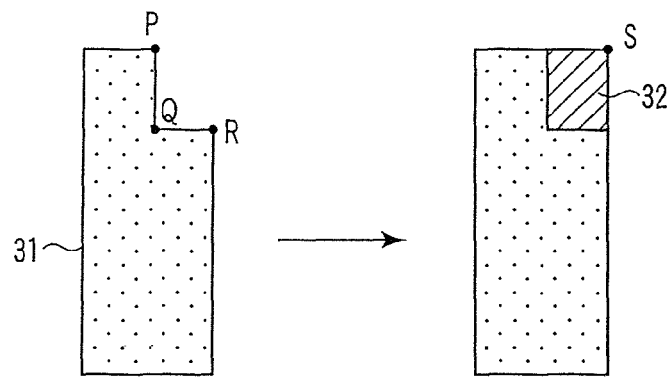
FIG. 10 is a diagram showing a design pattern in which a minute step exists in the vicinity of the pattern corner portion before correction.
FIG. 11 is a diagram showing the design pattern shown in FIG. 10 after correction.
Figure 12:
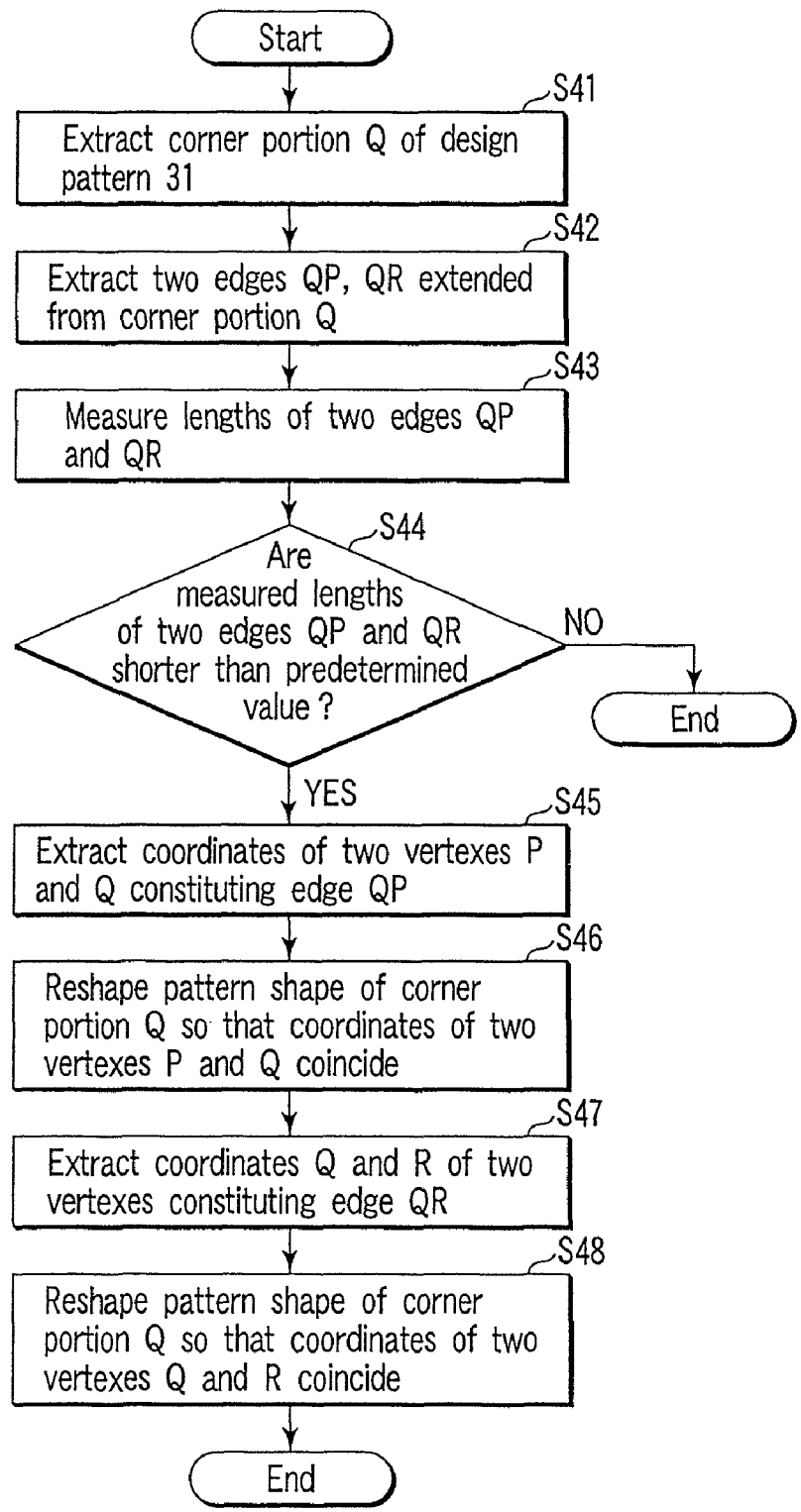
FIG. 12 shows a flow chart for correcting the design pattern shown in FIG. 10.

FIG. 10 shows a design pattern formed according to a conventional method, namely, a design pattern before the correction of this embodiment is carried out, and FIG. 11 shows an example of the design pattern formed by correction according to this embodiment. FIG. 12 shows the above-mentioned corrected flow chart.

As for the design pattern of FIG. 10, a corner portion Q of a pattern 31 is extracted (step 41), and two edges QP and QR extended from the corner portion Q are extracted (step 42). The lengths of the two extracted edges QP and QR are measured (step 43). If the lengths of both the QP and QR are a predetermined value or less, it is determined that this portion is a minute step (step 44). Two vertex coordinates P and Q constituting the edge QP are extracted (step 45), and the design pattern is reshaped such that these coordinates coincide each other (step 46). Likewise, two vertex coordinates Q and R which constitute the edge QR are extracted (step 47), and the design pattern is reshaped such that these coordinates coincide each other (step 48). The vertex P coinciding with the vertex Q and the vertex R coinciding with the vertex Q means the vertex P coinciding with the vertex R. Therefore, by extending a line other than QP including the vertex P while extending a line other than QR including the vertex R, the two vertexes P, R are matched with a vertex S as shown in FIG. 11. A hatched area 32 in FIG. 11 obtained in this way is a pattern added portion. That is, according to this embodiment, a pattern having no step can be formed by adding the hatched area 32 as shown in FIG. 11.

Figures 13, 14:
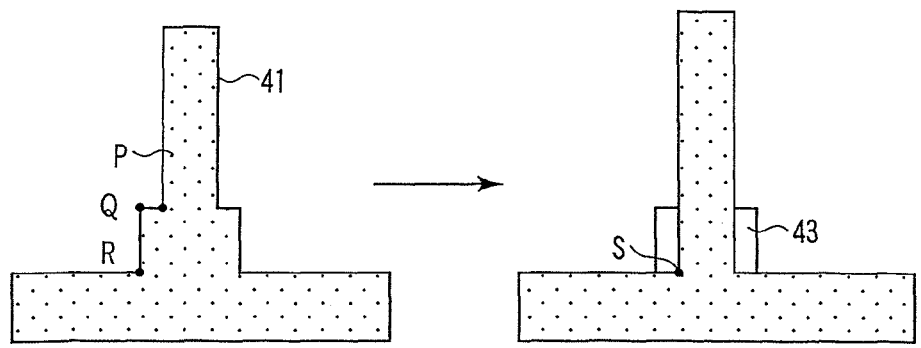
FIG. 13 is a diagram showing a design pattern in which a minute step exists in the vicinity of the pattern corner portion before correction.
FIG. 14 is a diagram showing the design pattern shown in FIG. 13 after correction.
Figure 15:
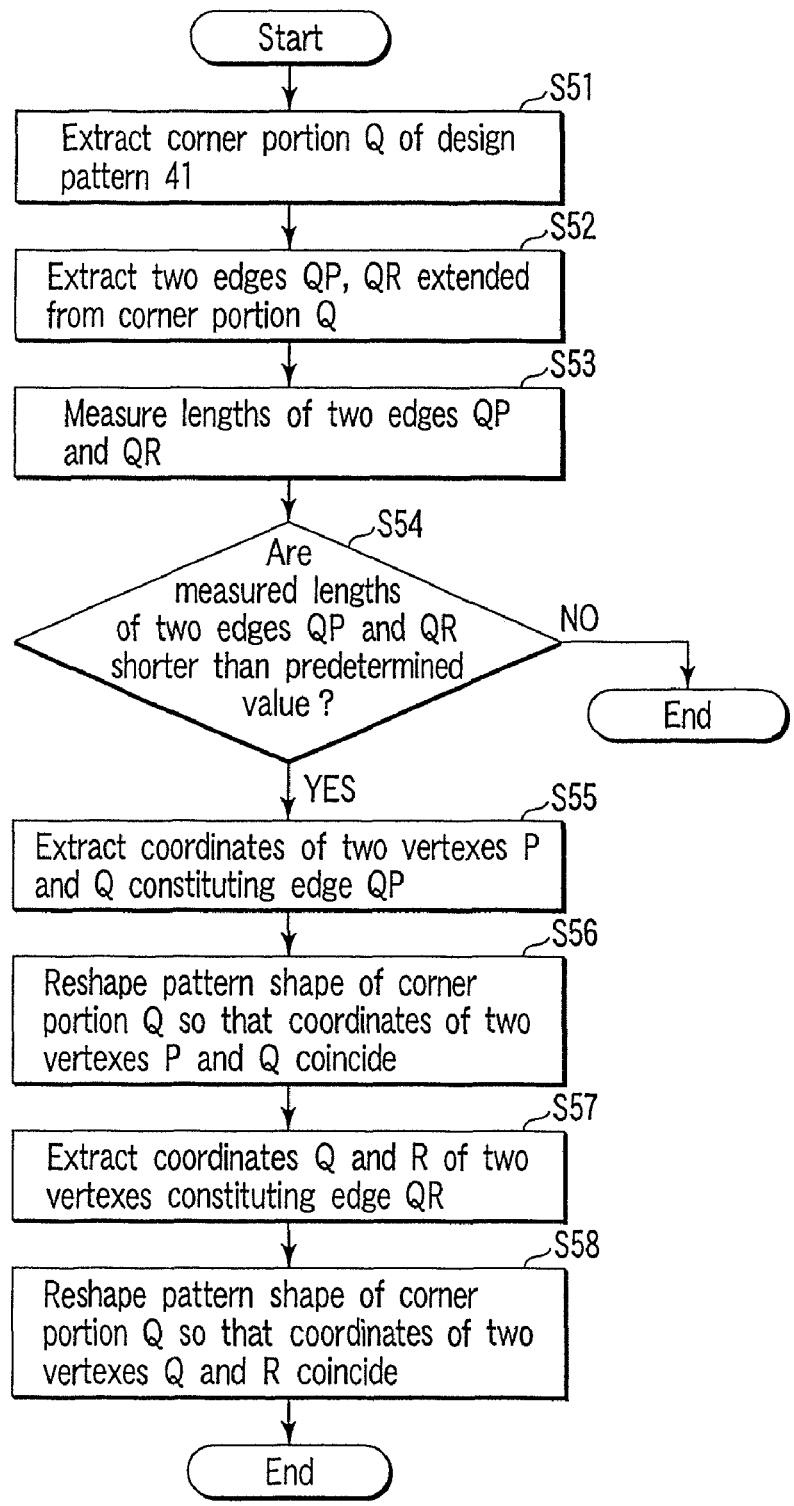
FIG. 15 shows a flow chart for correcting the design pattern shown in FIG. 13.

FIG. 13 shows a design pattern to be formed according to the conventional method, namely, a design pattern before the correction based on this embodiment. FIG. 14 shows an example of the design pattern to be formed by correction according to this embodiment. FIG. 15 shows a flow chart of the correction.

As for the design pattern of FIG. 13, a corner portion Q of a pattern 41 is extracted (step 51), and two edges QP and QR extended from the corner portion Q are extracted (step 52). The lengths of the two extracted edges QP and QR are measured (step 53). If the lengths of both the QP and QR are a predetermined value or less, it is determined that this portion is a minute step (step 54). Two vertex coordinates P and Q constituting the edge QP are extracted (step 55), and the design pattern is reshaped such that these coordinates coincide each other (step 56). Likewise, two vertex coordinates Q and R which constitute the edge QR are extracted (step 57), and the design pattern is reshaped such that these coordinates coincide each other (step 58). The vertex P coinciding with the vertex Q and the vertex R coinciding with the vertex Q means the vertex P coinciding with the vertex R. Therefore, by extending a line other than QP including the vertex P while extending a line other than QR including the vertex R, the two vertexes P, R are matched with a vertex S as shown in FIG. 14. A deleted area 43 in FIG. 14 obtained in this way is a pattern deleted portion. That is, according to this embodiment, a pattern having no step can be formed, by deleting the blank area 43 as shown in FIG. 14.

Figures 16, 17:
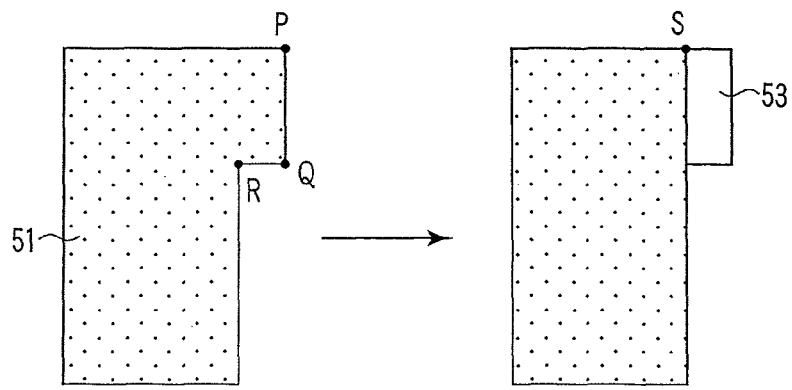
FIG. 16 is a diagram showing a design pattern in which a minute step exists in the vicinity of the pattern corner portion before correction.
FIG. 17 is a diagram showing the design pattern shown in FIG. 16 after correction.
Figure 18:
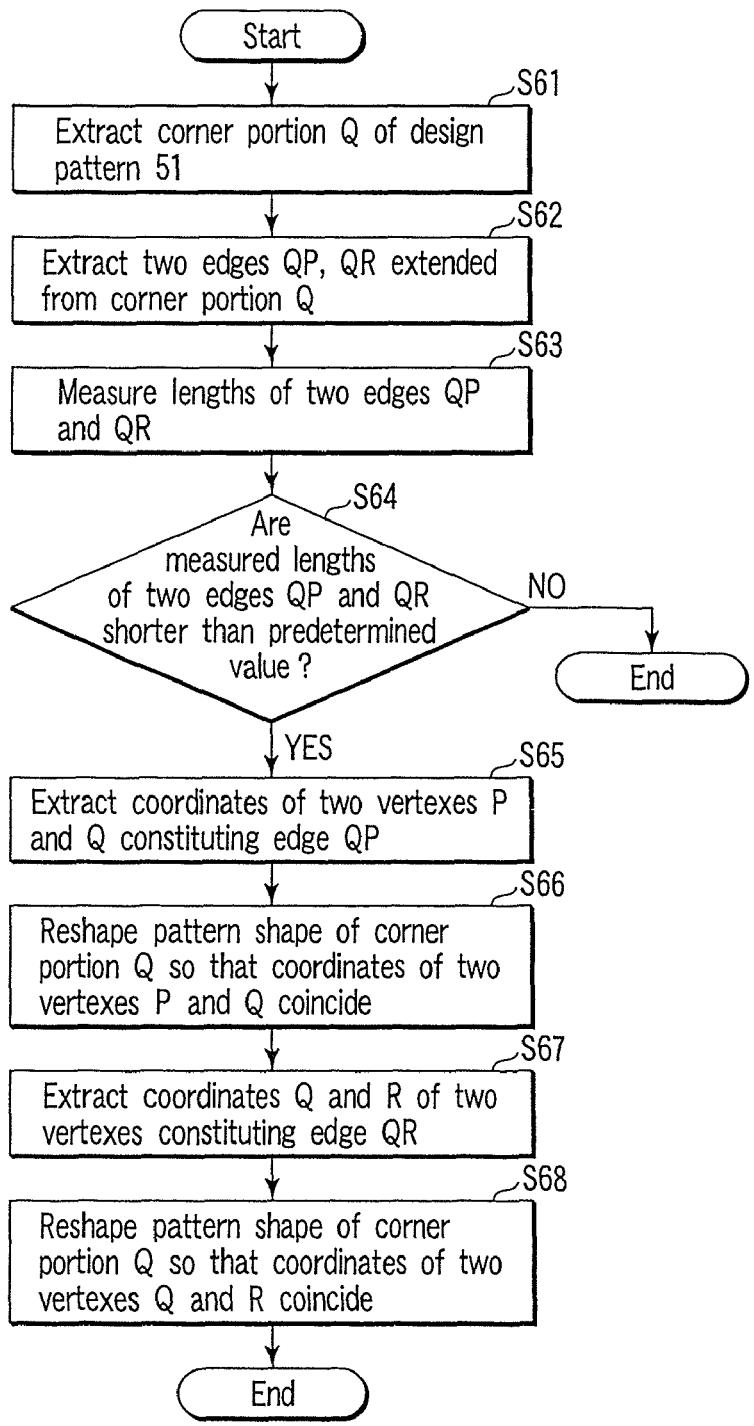
FIG. 18 shows a flow chart for correcting the design pattern shown in FIG. 16.

FIG. 16 shows a design pattern formed according to the conventional method, namely, a design pattern before correction based on this embodiment. FIG. 17 shows an example of the design pattern formed by correction according to this embodiment. FIG. 18 shows a flow chart of the correction.

As for the design pattern of FIG. 16, a corner portion Q of a pattern 51 is extracted (step 61), and two edges QP and QR extended from the corner portion Q are extracted (step 62). The lengths of the two extracted edges QP and QR are measured (step 63). If the lengths of both the QP and QR are a predetermined value or less, it is determined that this portion is a minute step (step 64). Two vertex coordinates P, Q constituting the edge QP are extracted (step 65), and the design pattern is reshaped such that these coordinates coincide each other (step 66). Likewise, two vertex coordinates Q, R which constitute the edge QR are extracted (step 67), and the design pattern is reshaped such that these coordinates coincide each other (step 68). The vertex P coinciding with the vertex Q and the vertex R coinciding with the vertex Q means the vertex P coinciding with the vertex R. Therefore, by extending a line other than QP including the vertex P while extending a line other than QR including the vertex R, the two vertexes P, R are matched with a vertex S as shown in FIG. 17. A blank area 53 in FIG. 17 obtained in this way is a pattern deleted portion. That is, according to this embodiment, a pattern having no step can be formed, by deleting the blank area 53 as shown in FIG. 17.

Figures 19, 20:
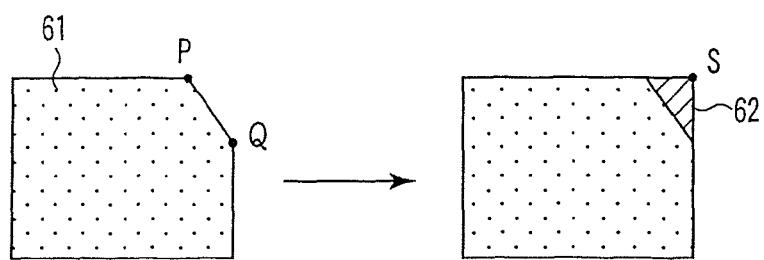
FIG. 19 is a diagram showing a design pattern in which a minute step exists in the vicinity of the pattern corner portion before correction.
FIG. 20 is a diagram showing the design pattern shown in FIG. 19 after correction.
Figure 21:
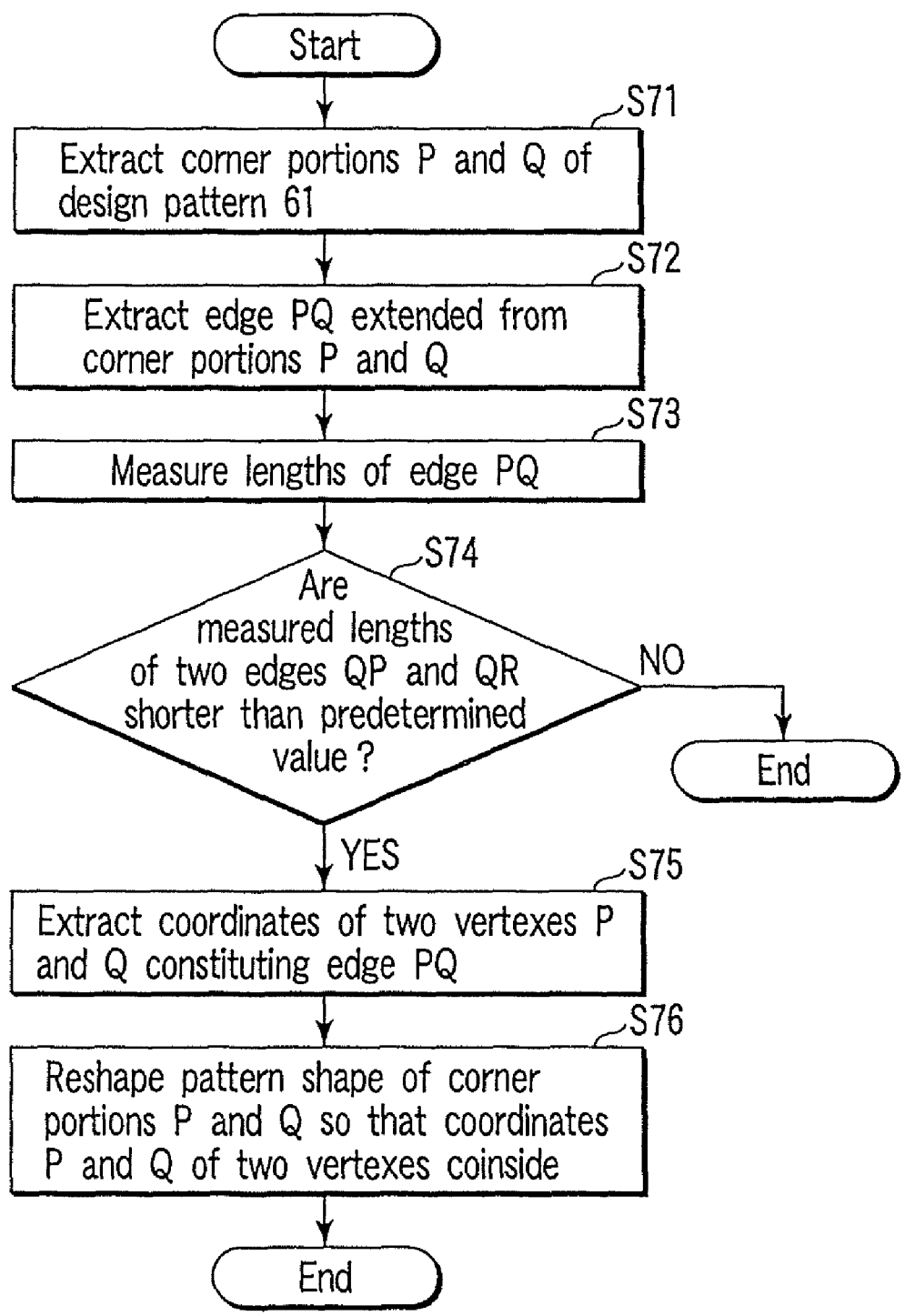
FIG. 21 shows a flow chart for correcting the design pattern shown in FIG. 19.

FIG. 19 shows a design pattern formed according to the conventional method, namely, a design pattern before correction based on this embodiment. FIG. 20 shows an example of the design pattern formed by correction according to this embodiment. FIG. 21 shows a flow chart of the correction.

As for the design pattern of FIG. 19, corner portions P and Q of a pattern 61 is extracted (step 71), and an edge PQ extended from the corner portions P and Q is extracted (step 72). The length of the extracted edge PQ is measured (step 73). If the length of the PQ is a predetermined value or less, it is determined that this portion is a minute step (step 74). Two vertex coordinates P and Q constituting the edge PQ are extracted (step 75), and the design pattern is reshaped such that these coordinates coincide each other (step 76). That is, by extending a line including the vertex P while extending a line including the vertex Q, the two vertexes P, Q are matched with a vertex S as shown in FIG. 20. A hatched area 62 in FIG. 20 obtained in this way is a pattern added portion. According to this embodiment, a pattern having no step can be formed by adding the hatched area 62 as shown in FIG. 20.

According to the embodiments, by detecting the length of an edge forming the corner portion to a design pattern possessing the minute step, the minute step can be extracted. By correcting the design pattern based on the extracted minute step, deterioration of correction accuracy at the corner portion can be prevented, thereby making it possible to form a highly accurate pattern.

Figures 22, 23, 24:
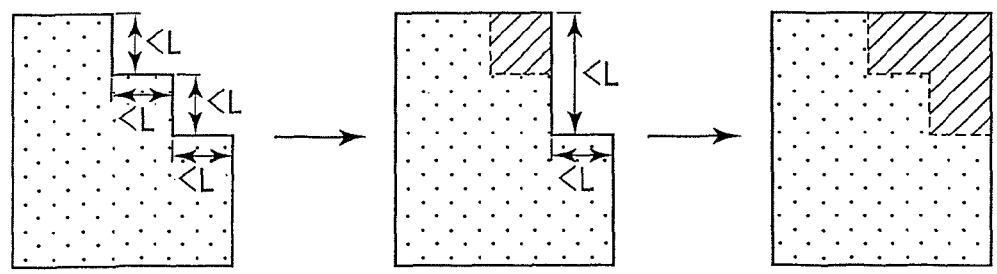
FIG. 22 is a diagram showing a design pattern in which two minute steps exist in the vicinity of the pattern corner portion before correction.
FIG. 23 is a diagram showing the design pattern shown in FIG. 22 after correction of the single minute step.
FIG. 24 is a diagram showing the design pattern shown in FIG. 22 after correction of the two minute step.

If a plurality minute steps are disposed continuously as shown in FIG. 22, the minute steps having an edge length less than a predetermined value can be deleted by executing the processing described above plural times. FIG. 22 shows an original design pattern and FIG. 23 shows a design pattern after the processing indicated by the above embodiments is executed a single time. By applying the above-described processing to the design pattern shown in FIG. 23 again, the minute steps can be deleted. FIG. 24 shows the design pattern after the second processing is carried out. By executing the processing indicated by the embodiments plural times, the minute pattern formed with edges less than the predetermined value can be deleted from the design pattern, so that a highly accurate pattern in which deterioration of the correction accuracy at the corner portion can be formed.

Fourth Embodiment

Next, a method of manufacturing a semiconductor device according to a fourth embodiment of the present invention will be explained with reference to FIGS. 25-31.

Here, a method of manufacturing a MOS (Metal Oxide Semiconductor) transistor as an example of semiconductor devices, by using a photo mask provided by the above-described embodiments, will be explained.

Figure 25:
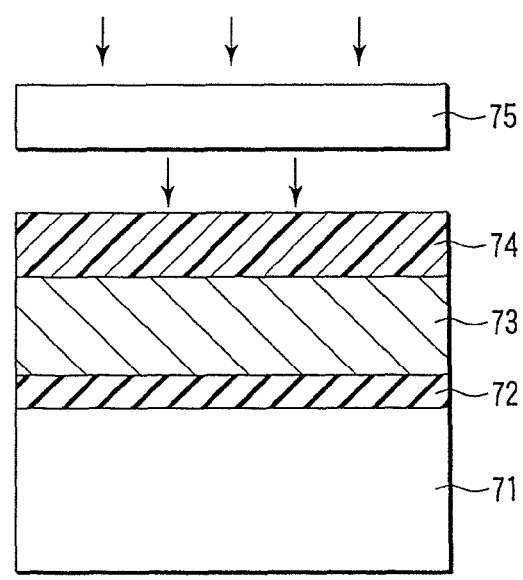
FIG. 25 is a cross sectional view showing a device structure in a step of a method of manufacturing a semiconductor device according to another embodiment of the present invention, which is used to explain the manufacturing method.

As shown in FIG. 25, a gate insulating film 72 is formed on a silicon semiconductor substrate 71 by using a thermal oxidation method, a polysilicon film 73 is formed on the gate insulating film 72 by CVD (Chemical Vapor Deposition) method. After that, the polysilicon film 73 and the gate insulating film 72 are subjected to patterning to form a gate structure comprised of the polysilicon film 73 and the gate insulating film 72. To form this gate structure, a photo resist layer 74 is formed on the polysilicon film 73, and then the photo resist layer 74 is patterning-processed by lithography to form a photo resist pattern.

At this patterning of the photo resist layer 74, use is made of a mask 75 manufactured by using a design pattern corrected by the design pattern process proximity effect correcting method as described in the second embodiment. To be specific, the mask 75 is mounted above the silicon semiconductor substrate 71, and light beams are radiated onto the silicon semiconductor substrate 71 via the mask 75 from a light beam source, not shown, to transfer a pattern of the mask 75 to the photo resist layer 74.

Figure 26:
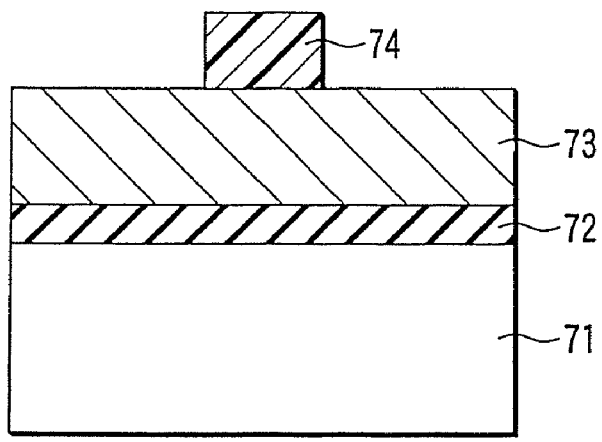
FIG. 26 is a cross sectional view showing a device structure in a step following to the step in FIG. 25 of the method of manufacturing the semiconductor device according to the embodiment of the present invention, which is used to explain the manufacturing method of the semiconductor device.

Subsequently, the transferred pattern is developed so that a photo resist pattern 74 corresponding to the pattern of the mask 75 is formed, as shown in FIG. 26.

Figure 27:
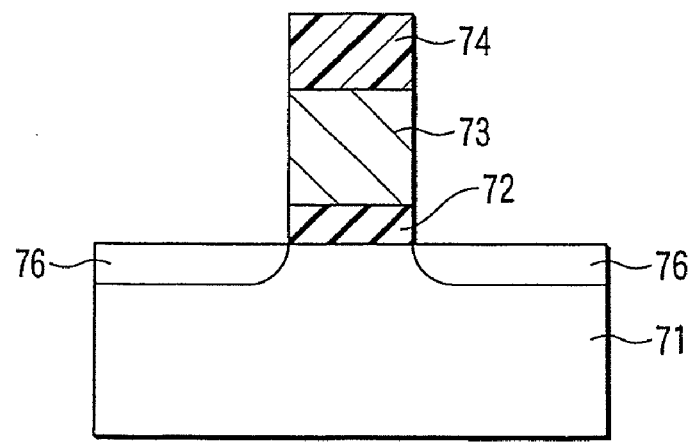
FIG. 27 is a cross sectional view showing a device structure in a step following to the step in FIG. 26 of the method of manufacturing the semiconductor device according to the embodiment of the present invention, which is used to explain the manufacturing method of the semiconductor device.

Next, as shown in FIG. 27, the polysilicon film 73 and the gate insulating film 72 are patterning-processed to form the gate structure comprised of the polysilicon film 73 and the gate insulating film 72, by using the photo resist pattern 74 as an etching mask. Then, impurities are implanted into the silicon semiconductor substrate 71 to form source/drain regions 76, by using the photo resist pattern 74, the polysilicon film 73 (polysilicon electrode) and the gate insulating film 72, as a mask.

Figure 28:
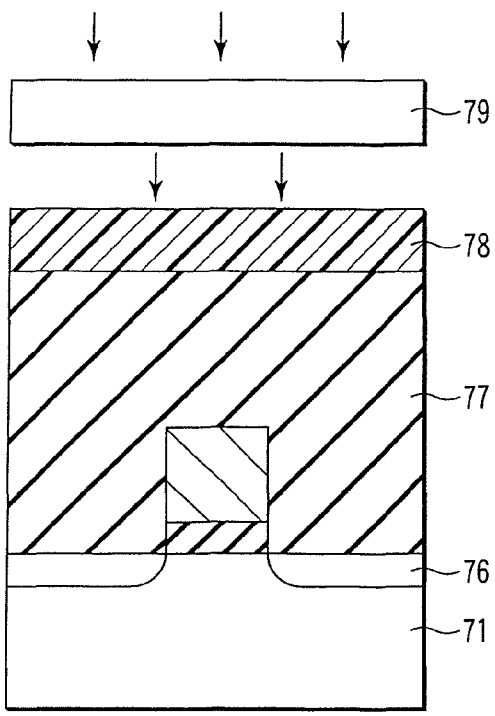
FIG. 28 is a cross sectional view showing a device structure in a step following to the step in FIG. 27 of the method of manufacturing the semiconductor device according to the embodiment of the present invention, which is used to explain the manufacturing method of the semiconductor device.

Subsequently, the photo resist pattern 74 is removed by a known method. Then, as shown in FIG. 28, an interlayer insulating film 77 is formed over the silicon semiconductor substrate 71 by CVD method. Following this, openings are formed in the interlayer insulating film 77 for contact to the polysilicon electrode 73 and source/drain regions 76. To form the openings, a photo resist layer 78 is formed on the interlayer insulating film 77, and then the photo resist layer 78 is patterning-processed by lithography to form a photo resist pattern.

At this patterning of the photo resist layer 78, use is made of a mask 79 manufactured by using a design pattern corrected by the design pattern process proximity effect correcting method as described in the second embodiment. To be specific, the mask 79 is mounted above the silicon semiconductor substrate 71, and light beams are radiated onto the silicon semiconductor substrate 71 via the mask 79 from a light beam source, not shown, to transfer a pattern of the mask 79 to the photo resist layer 78.

Figure 29:
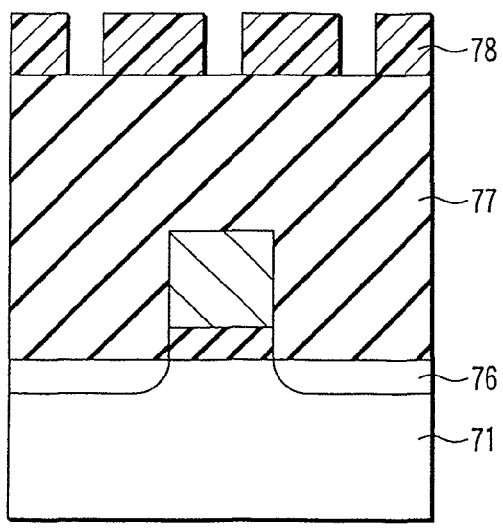
FIG. 29 is a cross sectional view showing a device structure in a step following to the step in FIG. 28 of the method of manufacturing the semiconductor device according to the embodiment of the present invention, which is used to explain the manufacturing method of the semiconductor device.

Subsequently, the transferred pattern is developed so that a photo resist pattern 78 corresponding to the pattern of the mask 79 is formed, as shown in FIG. 29.

Figure 30:
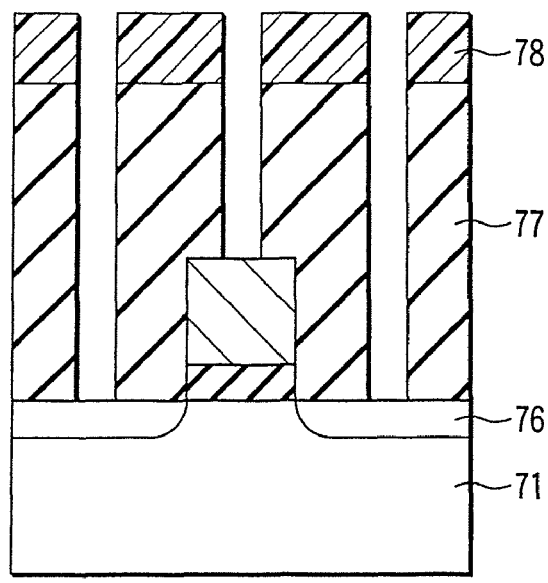
FIG. 30 is a cross sectional view showing a device structure in a step following to the step in FIG. 29 of the method of manufacturing the semiconductor device according to the embodiment of the present invention, which is used to explain the manufacturing method of the semiconductor device.

Next, as shown in FIG. 30, the interlayer insulating film 77 is patterning-processed to form the openings for contact to the polysilicon electrode 73 and source/drain regions 76, by using the photo resist pattern 78 as an etching mask.

Figure 31:
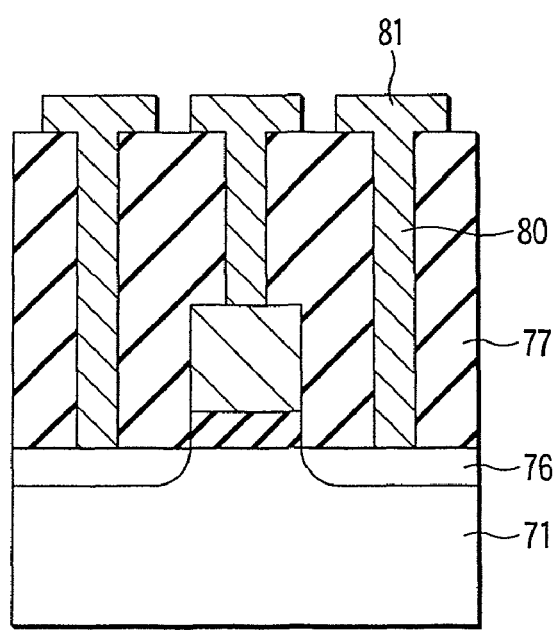
FIG. 31 is a cross sectional view showing a device structure in a step following to the step in FIG. 30 of the method of manufacturing the semiconductor device according to the embodiment of the present invention, which is used to explain the manufacturing method of the semiconductor device.

Subsequently, the photo resist pattern 78 is removed by a known method. Then, as shown in FIG. 31, contact metals 80 are formed in the openings for contact to the polysilicon electrode 73 and source/drain regions 76, and wiring metals 81 contacting the contact metals 50 are formed on the interlayer insulating film 77 by a known method. With the manufacturing method, since use is made in each of the patterning processes of a mask manufactured by using a design pattern corrected by the design pattern process proximity effect correcting method as described in the above described embodiments (for example, the second example), desired patterns are formed on the semiconductor wafer with high accuracy, resulting in providing a highly accurate semiconductor device.

According to the embodiments of the present invention, it is possible to improve dimensional precision of a resist pattern formed in an exposure technique which forms a liquid film in a local region on a resist film.

According to the embodiments of the present invention, the shape of the corner portion in which deterioration of the resolution remarkably appears can be finished as a desired pattern indicates. As a result, the yield of device manufacturing can be greatly improved.

The minute steps disposed in the vicinity of the corner portion of the design pattern is an obstacle to forming a desired shape on the wafer for the process proximity effect correction, thereby inducing deterioration of the yield of the device. According to the embodiments of the present invention, by forming a pattern excluding the minute steps and carrying out the process proximity effect correction on the data, the planar shape on the wafer at the pattern corner portion can be finished into a desired pattern.

In the meantime, the present invention is not restricted to the above-described respective embodiments but may be modified in various ways within a scope not departing from the gist of the invention. There have been described the design pattern forming method based on the new design rule as the first embodiment, the process proximity effect correcting method as the second embodiment, the design pattern correcting method for correcting the design pattern as the third embodiment, and the method of manufacturing a semiconductor device as the fourth embodiment. The present invention can be applied to the mask pattern forming method for forming a pattern subjected to the process proximity effect correction for the design pattern formed by the first and third embodiments. Further, the present invention can be applied to the mask manufacturing method for manufacturing a mask from the mask pattern formed according to the first to third embodiments.

In addition, the design pattern correcting method and the design pattern process proximity effect correcting method described in the embodiments can be distributed by storing as a program which can be executed by a computer in a recording medium such as a magnetic disk (such as floppy (registered trademark) disk or hard disk), an optical disk (such as a CD-ROM or DVD), an optical magnetic disk (such as MO), or a semiconductor memory. Any types of recording mediums can be used as long as the program can be recorded in the recording mediums and executed by a computer. The program including a sequence of procedures can be distributed as recording mediums via a communication network such as LAN or Internet. Any types of computers can be used as long as the computers can execute the above-described processing operations by reading the program recorded in a recording medium and controlling an operation in accordance with the program.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A design pattern process proximity effect correcting method performed by a computer for correcting a design pattern process proximity effect of a design pattern in relation to a minute step of the design pattern, comprising:
   extracting, by the computer, an edge extended from a predetermined vertex of the design pattern;
   measuring a length of the extracted edge;
   determining whether or not the length of the measured edge is shorter than a predetermined value;
   extracting, by the computer, two vertexes connected to the extracted edge if it is determined that the length of the extracted edge is shorter than the predetermined value;
   dividing the extracted edge into edge units for pattern correction with a vertex excluding the two extracted vertexes as a starting point;
   allocating a correction value for said each divided edge unit; and
   resizing the design pattern corresponding to the correction value for said each allocated edge unit.

2. The design pattern process proximity effect correcting method of claim 1, wherein the predetermined value is less than a minimum width which limits the design pattern.

3. A mask manufacturing method comprising:
   providing a design pattern;
   correcting the design pattern; and
   manufacturing a mask using the corrected design pattern,
   wherein correcting the design pattern comprises:
   extracting, by a computer, an edge extended from a predetermined vertex of the design pattern;
   measuring a length of the extracted edge;
   determining whether or not the length of the measured edge is shorter than a predetermined value;
   extracting, by the computer, two vertexes connected to the extracted edge if it is determined that the length of the extracted edge is shorter than the predetermined value;
   dividing the extracted edge into edge units for pattern correction with a vertex excluding the two extracted vertexes as a starting point;
   allocating a correction value for said each divided edge unit; and
   resizing the design pattern corresponding to the correction value for said each allocated edge unit.

4. The mask manufacturing method of claim 3, wherein the predetermined value is less than a minimum width which limits the design pattern.

5. A semiconductor device manufacturing method comprising:
   providing a design pattern;

correcting the design pattern;

manufacturing a mask using the corrected design pattern; and forming a pattern of a desired shape on a wafer by exposing the wafer to light by using the mask, wherein correcting the design pattern comprises:

extracting, by a computer, an edge extended from a predetermined vertex of the design pattern;

measuring a length of the extracted edge;

determining whether or not the length of the measured edge is shorter than a predetermined value;

extracting, by the computer, two vertexes connected to the extracted edge if it is determined that the length of the extracted edge is shorter than the predetermined value;

dividing the extracted edge into edge units for pattern correction with a vertex excluding the two extracted vertexes as a starting point;

allocating a correction value for said each divided edge unit; and resizing the design pattern corresponding to the correction value for said each allocated edge unit.

6. The semiconductor device manufacturing method of claim 5, wherein the predetermined value is less than a minimum width which limits the design pattern.

7. A computer program product having a non-transitory computer readable storage medium including programmed instructions for causing a computer to execute a design pattern process proximity effect correcting method, the method comprising:

extracting an edge extended from a predetermined vertex of the design pattern;

measuring a length of the extracted edge;

determining whether or not the length of the measured edge is shorter than a predetermined value;

extracting two vertexes connected to the extracted edge if it is determined that the length of the extracted edge is shorter than the predetermined value;

dividing the extracted edge into edge units for pattern correction with a vertex excluding the two extracted vertexes as a starting point;

allocating a correction value for said each divided edge unit; and resizing the design pattern corresponding to the correction value for said each allocated edge unit.

8. The computer program product of claim 7, wherein the predetermined value is less than a minimum width which limits the design pattern.

* * * * *